(12) United States Patent
Mansuri et al.

(10) Patent No.: US 7,683,729 B2
(45) Date of Patent: Mar. 23, 2010

(54) INJECTION LOCKED LC VCO CLOCK DESKEWING

(75) Inventors: Mozhgan Mansuri, Hillsboro, OR (US); Sudip Shekhar, Seattle, WA (US); Bryan K. Casper, Hillsboro, OR (US); Frank P. O'Mahony, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 159 days.

(21) Appl. No.: 11/731,776

(22) Filed: Mar. 30, 2007

(65) Prior Publication Data

US 2008/0238503 A1  Oct. 2, 2008

(51) Int. Cl.
*H03K 3/282* (2006.01)

(52) U.S. Cl. .......................... 331/117 R; 331/117 FE; 331/167; 327/103; 327/156

(58) Field of Classification Search ............ 331/117 R, 331/117 FE, 167; 327/103, 156
See application file for complete search history.

(56) References Cited

U.S. PATENT DOCUMENTS

| | | | | |
|---|---|---|---|---|
| 6,317,008 B1* | 11/2001 | Gabara | .................. | 331/117 R |
| 6,337,604 B1* | 1/2002 | Clarke | .................... | 331/116 R |
| 6,346,838 B1* | 2/2002 | Hwang et al. | ............... | 327/156 |
| 7,336,134 B1* | 2/2008 | Janesch et al. | ............ | 331/36 C |
| 2003/0025566 A1* | 2/2003 | Rogers | ........................ | 331/109 |
| 2003/0042985 A1* | 3/2003 | Shibahara et al. | ............. | 331/17 |
| 2006/0139110 A1* | 6/2006 | Li | ............................ | 331/36 C |

OTHER PUBLICATIONS

Sidiropoulos, Stefanos, et al., "A semidigital dual delay-locked loop", *IEEE Journal of solid state circuits*, vol. 32, No. 11, (Nov. 1997),1683-1692.
Wong, K-L J., et al., "A 27-mW 3.6-Gb/s I/O Transceiver", *JSSC*, vol. 39, No. 4, (Apr. 2004), 602-612.

* cited by examiner

*Primary Examiner*—Joseph Chang
*Assistant Examiner*—Jeffrey Shin
(74) *Attorney, Agent, or Firm*—Ryder, Lu, Mazzeo and Konieczny, LLC; Douglas J. Ryder

(57) ABSTRACT

In general, in one aspect, the disclosure describes an apparatus that includes an inductive capacitive voltage controlled oscillator (LC VCO) to generate an output clock. A voltage to current converter is used to receive a forwarded clock and to inject the forwarded clock to the LC VCO. The output clock is a deskewed version of the forwarded clock.

18 Claims, 5 Drawing Sheets

INJECTION LOCKED LC VCO CLOCK DESKEWING

BACKGROUND

In forwarded clock I/O links, one data channel is dedicated to forward the clock (e.g., differential signal) to a receiver. The forwarded clock is attenuated due to channel loss. The receiver recovers and deskews the clock so that it can sample received data in the middle of the eye.

FIG. 1 illustrates an example receiver 100 used to recover a forwarded clock in order to accurately sample data. The receiver 100 includes a clock recovery unit 110, a clock buffer 140, and first and second data receivers 150, 160. The clock recovery unit 110 includes a pre-amplifier 115, a delay lock loop (DLL) 120, a multiplexer 130, and an interpolator 135. The data receivers 150, 160 include amplifiers 152, 162 and latches 154, 164 respectively.

The forwarded clock signal is received and amplified by the pre-amplifier 115 which provides the forwarded clock to the DLL 120. The DLL 120 generates N clock phases based on the forwarded clock. The N clock phases are provided to the multiplexer 130 that may select two clock phases (e.g., 0 to 180 degrees CLK, 0 to -180 degrees for CLKBAR) out of N phases generated by N-stage DLL 120. The interpolator 135 may interpolate the two selected clock phases so a clock phase between 0-360 degrees may be generated with high resolution (e.g., within 1°). The recovered clock may be provided to the latches 154, 164 via the clock buffer 140. The clock buffer 140 is used to absorb the capacitive loading of the receiver latches 154, 164. Each latch 152, 154 may receive a different leg of the recovered clock signal (e.g., CLK to 154, CLKBAR to 164). Data is received by the amplifiers 152, 162 and the data is clocked into the latches 154, 164 based on the recovered clock provided.

The components of the clock recovery unit 110 (the pre-amplifier 115, the DLL 120, the multiplexer 130 and the interpolator 135) may be delay sensitive to supply noise and accordingly supply noise jitter may be induced in the forwarded clock. The jitter induced in the forwarded clock may be amplified due to bandwidth limitation of clock deskewing path. Due to large number of delay cells used to implement the clock recovery unit 110, the receiver 100 may consume significant power.

BRIEF DESCRIPTION OF THE DRAWINGS

The features and advantages of the various embodiments will become apparent from the following detailed description in which.

DETAILED DESCRIPTION

Figure 1:
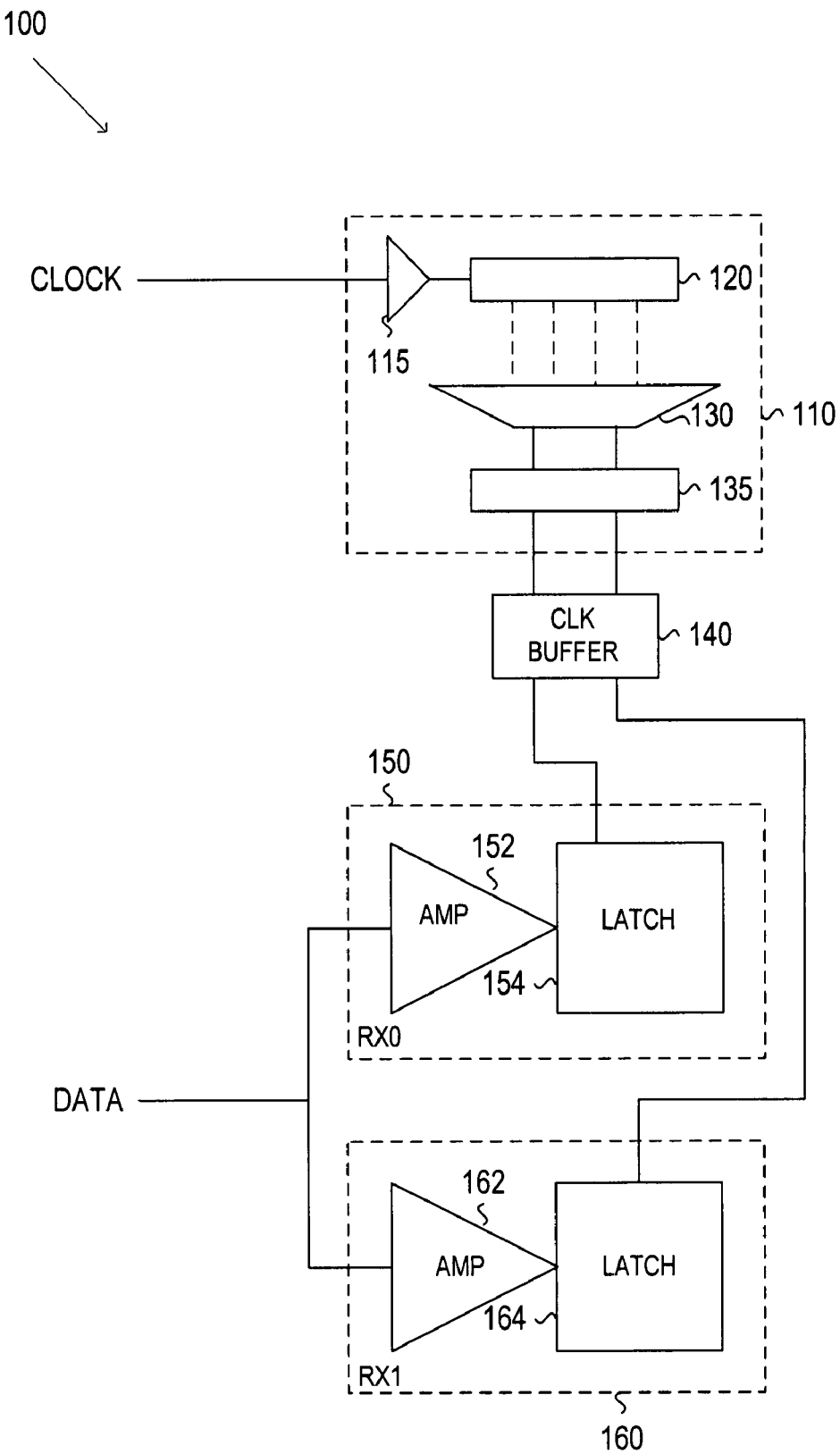
FIG. 1 illustrates an example receiver used to recover a forwarded clock in order to accurately sample data, according to one embodiment.
Figure 2:
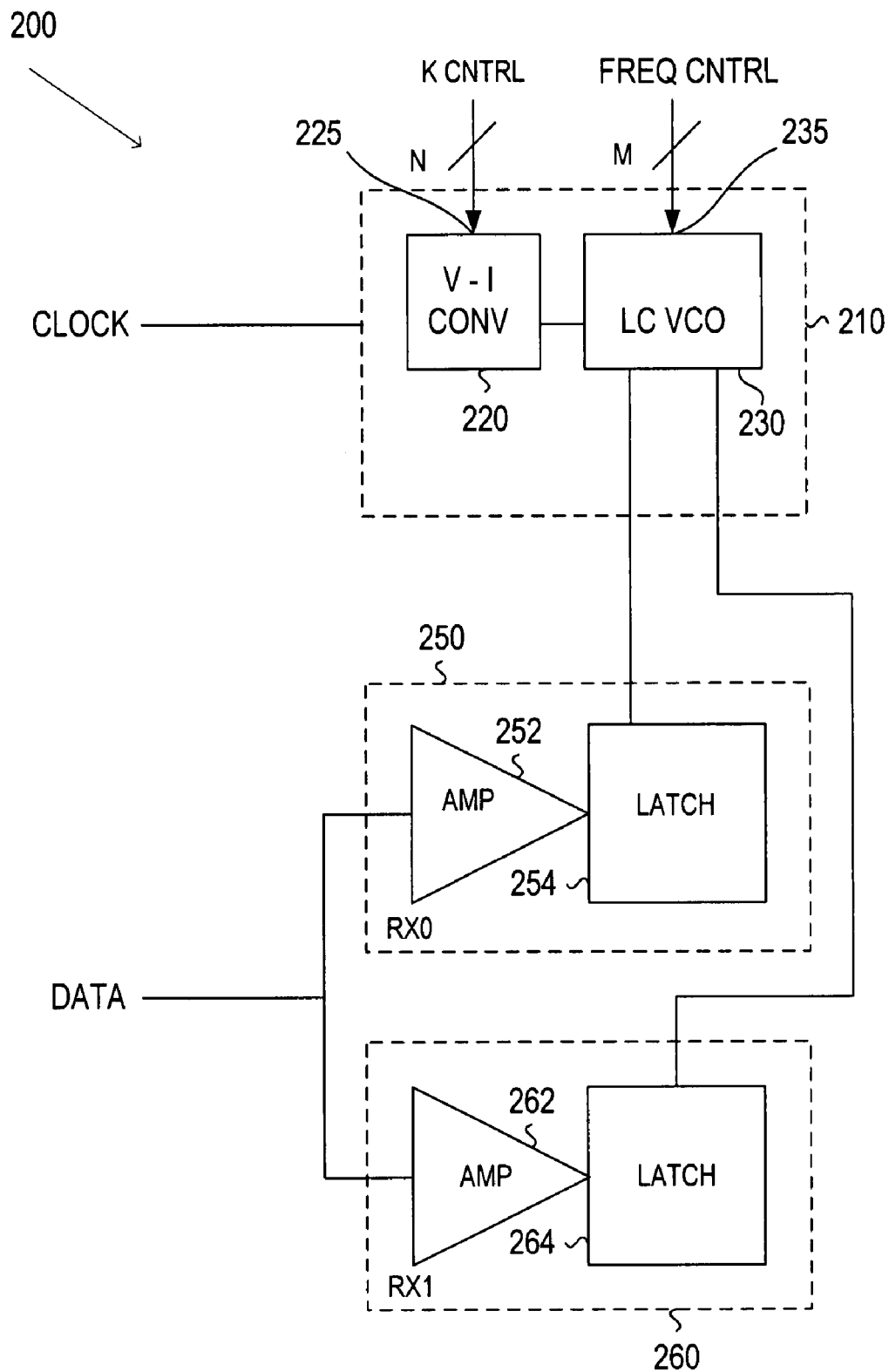
FIG. 2 illustrates an example receiver used to recover a forwarded clock in order to accurately sample data, according to one embodiment.

FIG. 2 illustrates an example receiver 200 used to recover a forwarded clock (differential signal) in order to accurately sample data. The receiver 200 includes a clock recovery unit 210 and first and second data receivers 250, 260. The clock recovery unit 210 includes a voltage to current (V-I) converter 220 and an inductive capacitive (LC) voltage controlled oscillator (VCO) 230. The data receivers 250, 260 include amplifiers 252, 262 and latches 254, 264 respectively. The data receivers 250, 260 may be the same as, or similar to, the data receivers 150, 160 of FIG. 1 and act in the same or a similar manner.

The forwarded clock signal is received by the V-I converter 220 that injects the forwarded clock to the LC VCO 230. The injection locked frequency of the LC VCO 230 is forced to be the forwarded clock frequency. However, there will be a phase difference between the injection locked frequency and the injected clock that is a function of injection strength (K), the Q of the LC tank, and the frequency difference between the injected signal and free running frequency of the LC VCO 210. The frequency of the free running LC VCO 230 may be modified by utilizing VCO frequency control 235 (e.g., M bits). The injection strength (K) of the V-I converter 220 can be modified utilizing K control 225 (e.g., N bits).

Phase deskewing can be implemented by sweeping the frequency of the free running LC VCO 210 from a base frequency equal to injection locking clock frequency (the forwarded clock) that provides no deskew. The phase deskew range, the deskew resolution and the deskew-frequency linearity (between −90 and 90 degrees) are all a function of K. As K increases the phase resolution and phase linearity improve and the deskew range increases. Furthermore, as K increases the range of frequencies at which the LC VCO 210 can lock is increased. However, as K increases, more frequency tuning range for the LC VCO is required to provide 180 degrees deskewing.

Figure 3:
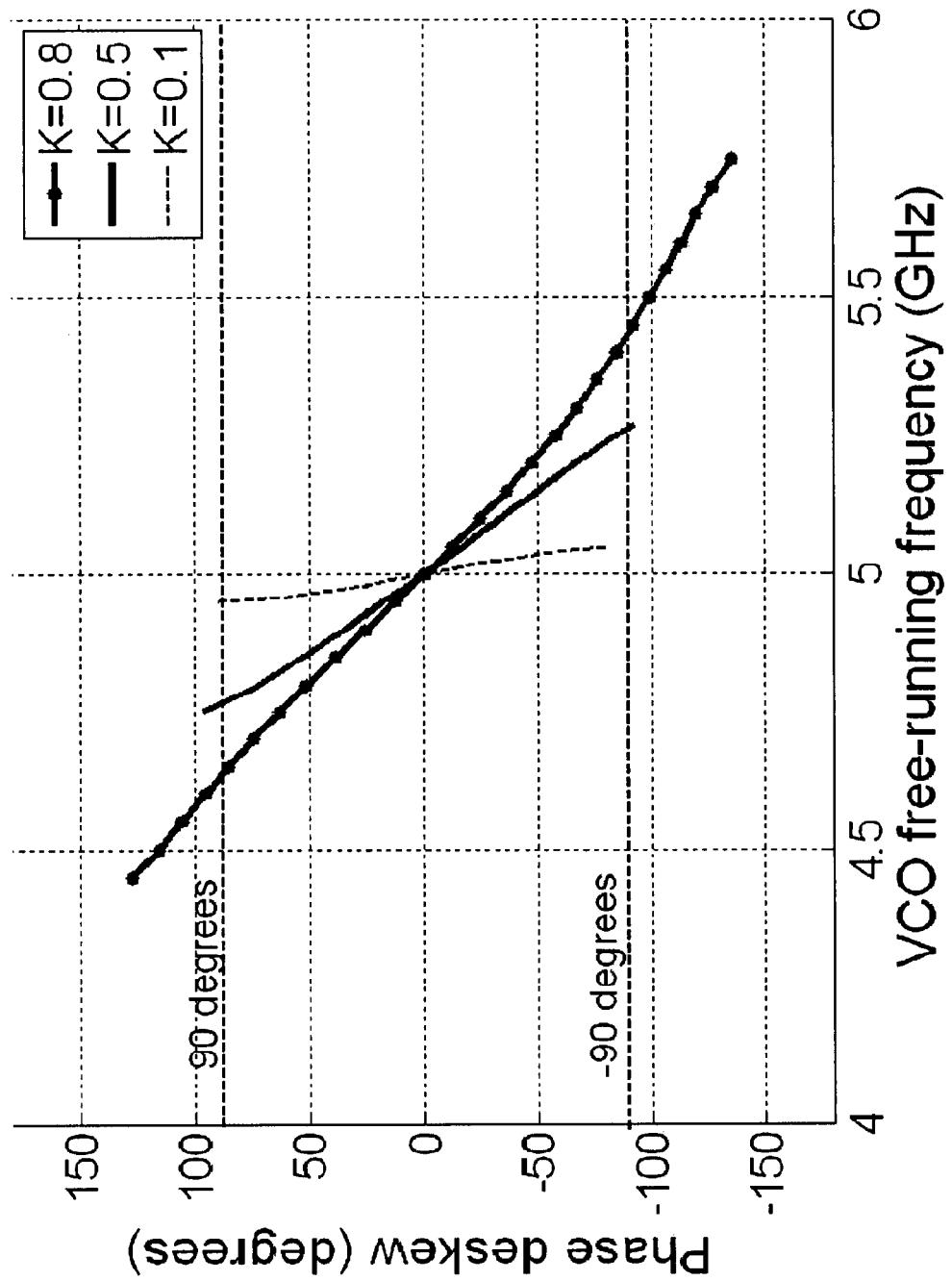
FIG. 3 illustrates an example frequency versus deskew graph for various K values, according to one embodiment.

FIG. 3 illustrates an example frequency versus deskew graph for various K values for an injection locking frequency of 5 GHz. As illustrated, an LC VCO with free running frequency of 5 GHz results in no phase deskew. As the free running frequency is reduced from 5 GHz positive phase deskew is obtained and as the frequency is increased negative phase deskew is obtained. The deskew frequency relationship exhibits that deskew range, linearity and resolution depend on K.

For example, on the K=0.1 line a deskew of approximately −90 to 80 degrees is obtained and the frequency range to obtain these deskew values is approximately 4.95 to 5.05 GHz. On the K=0.5 line a deskew of approximately −100 to 100 degrees is obtained and the frequency range to obtain these deskew values is approximately 4.75 to 5.25 GHz. On the K=0.8 line a deskew of approximately −140 to 140 degrees is obtained and the frequency range to obtain these deskew values is approximately 4.4 to 5.7 GHz. As can be seen as K increases the phase resolution and phase linearity (between −90 and 90 degrees) improve and the range of frequencies at which the LC VCO can lock is increased In the example of FIG. 3, a deskew of 180 degrees (−90 to +90) was obtained with a fairly high degree of resolution (e.g., on the order of 2 and 4 degrees for a 0.01 GHz frequency step for K=0.8 and K=0.5 respectively).

Figure 4:
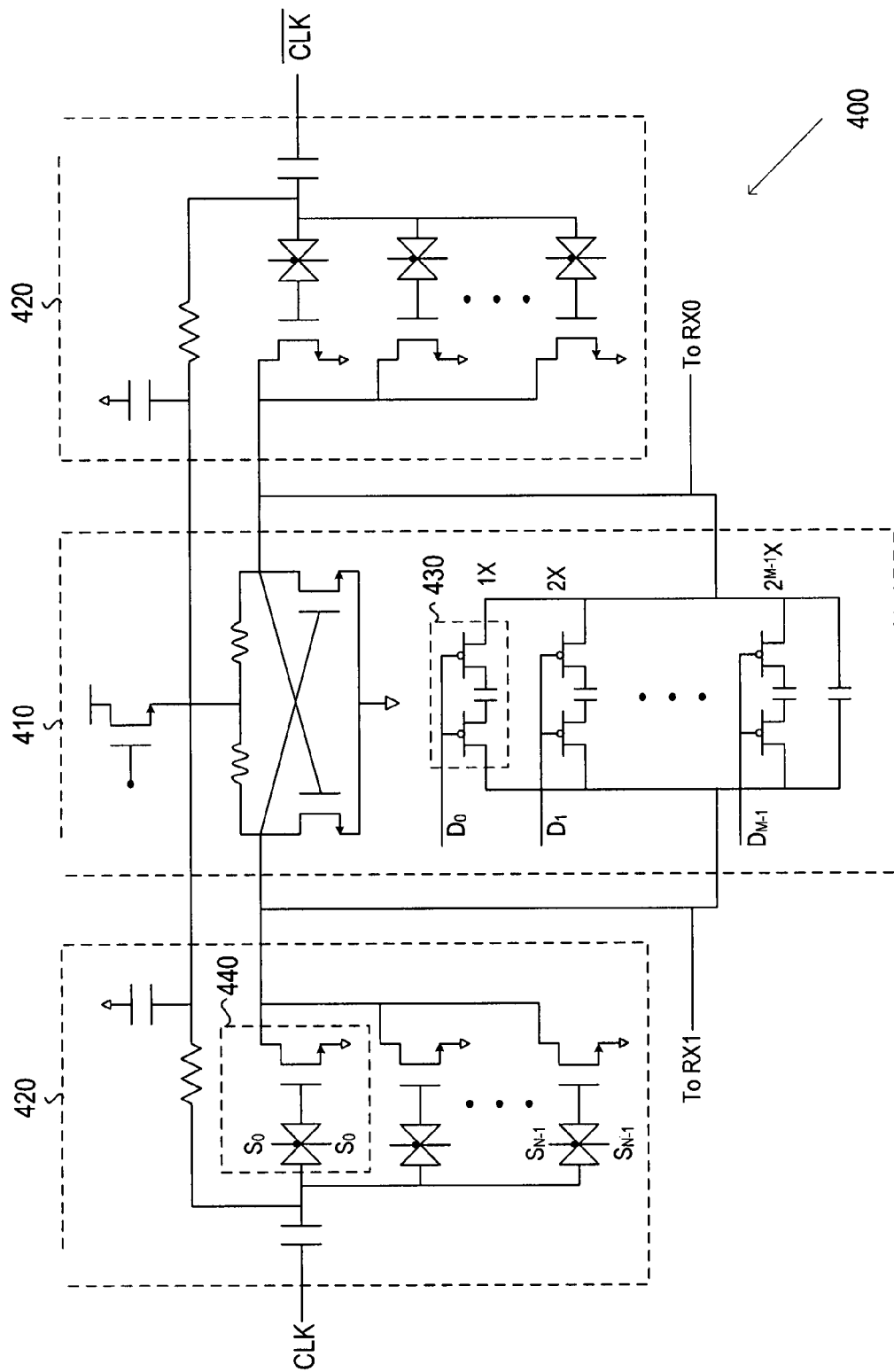
FIG. 4 illustrates an example LC VCO, according to one embodiment.

FIG. 4 illustrates an example injection locked LC VCO clock recovery unit 400 (e.g., 210 of FIG. 2). The injection locked LC VCO clock recover unit 400 includes an LC VCO 410 to generate the clock and a pair of voltage to current converters 420 (one for CLK and one for CLKBAR) to convert the clock voltage to a current that is injected into the LC VCO 410.

The LC VCO 410 includes M capacitance rows 430 ($D_0$-$D_{M-1}$) to select the free running frequency thereof. The switched capacitor rows 430 include transistors surrounding a capacitor. When the transistors are turned on the capacitance of the capacitor is added to the circuit and the free running frequency is reduced. The capacitance rows 430 are controlled by control signals ($D_0$-$D_{M-1}$). When a-control signal associated with a particular capacitance row 430 is activated (e.g., set to 1) the transistors are turned on. Each successive capacitance row 430 may have twice the capacitance as the previous row.

The voltage to current converters 420 include N current rows 440 ($S_0$-$S_{N-1}$) to select the injection strength. The current rows 440 include a pass gate and a transistor. When the pass gate is turned on the clock voltage is provided to the transistor and the transistor generates a corresponding current that is provided to the LC VCO 410. The pass gates may be controlled by select signals ($S_0$-$S_{N-1}$). When a control signal associated with a particular current row 440 is activated (e.g., set to 1) the pass gate is turned on. The amount of current generated is based on the number of current rows 440 that are activated (the more activated the more current generated). The K value is the ratio of the current provided by the voltage to current invertors 420 to the current provided by the LC VCO 410.

An injection locked LC VCO clock recovery unit (e.g., 400, 210) may generate clock phases between 0-180 degrees with a phase resolution of 2-4 degrees. The injection locked LC VCO clock recovery unit can achieve lower jitter due to supply noise than a DLL clock deskewing technique. The LC VCO achieves better supply noise sensitivity as the free running frequency is set with supply-independent passive elements (LC). Also, the injection locked LC VCO clock recovery unit does not amplify the forwarded clock jitter and in fact rejects the jitter outside the locking range of the LC VCO. Moreover, the injection locked LC VCO clock recovery unit can absorb the receiver capacitive loading into the LC tank (so that the clock buffers of the DLL clock deskewing technique are not required). The injection locked LC VCO may consume less power than a DLL clock deskewing technique.

An injection locked LC VCO may be utilized in I/O receivers in any number of systems where a clock is forwarded along with the data in order to clock in the data. The injection locked LC VCO may be best utilized in I/O systems with two-way interleaved receivers (as illustrated in FIG. 2) where the clock is likely to be skewed by no more than 180 degrees (−90 to 90 degrees). A cascaded injection locked LC VCO clock recovery system may be utilized in I/O systems with a one-way interleaved receiver where the clock is likely to be skewed by 360 degrees. For a four-way interleaved receiver, a quadratue injection locked LC VCO may be used to generate the four phases of clock with the required deskew of 90 degrees.

Figure 5:
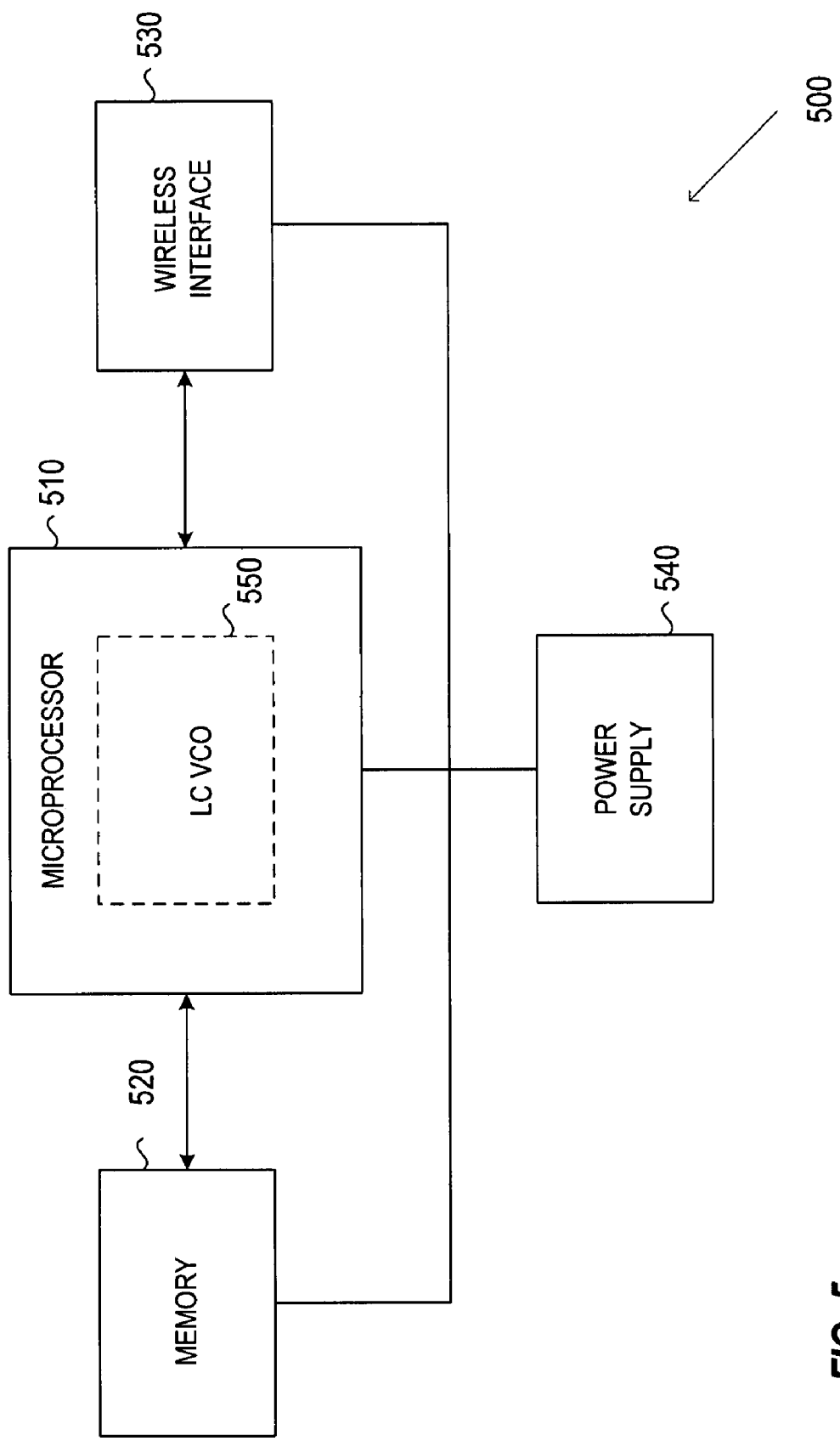
FIG. 5 illustrates an example system utilizing an LC VCO, according to one embodiment.

FIG. 5 illustrates a wireless system 500 that includes a microprocessor 510 to control the system, memory 520 to store date, a wireless interface 530 to provide wireless communications and a power supply 540 to provide power to the other components. The microprocessor 510 may implement an injection locked LC VCO clock recovery unit 550.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
    an inductive capacitive voltage controlled oscillator (LC VCO) to generate an output clock; and
    a programmable voltage to current converter to receive a forwarded clock and to inject the forwarded clock to the LC VCO, wherein injection strength of the forwarded clock is generated based on voltage to current ratio selected for the programmable voltage to current converter, and wherein the output clock is a deskewed version of the forwarded clock.

2. The apparatus of claim 1, wherein the LC VCO is to generate the output clock having same frequency as the forwarded clock, wherein a phase difference between the output clock and the forwarded clock is based at least on some subset of free running frequency of the LC VCO and the injection strength of the forwarded clock.

3. The apparatus of claim 2, wherein the LC VCO is to deskew phase differences by adjusting the free running frequency of the LC VCO.

4. The apparatus of claim 3, wherein the programmable voltage to current converter is to convert the forwarded clock to a current, wherein the current is to control the injection strength of the forwarded clock.

5. The apparatus of claim 4, wherein linearity of relationship between the free running frequency and the phase deskew is based on the injection strength of the forwarded clock.

6. The apparatus of claim 5, wherein the linearity is improved as the injection strength of the forwarded clock is increased.

7. The apparatus of claim 4, wherein phase deskew resolution is based on the injection strength of the forwarded clock.

8. The apparatus of claim 7, wherein phase deskew resolution is improved as the injection strength of the forwarded clock is increased.

9. The apparatus of claim 2, wherein the LC VCO is to program a selectable amount of capacitance, wherein the amount of capacitance selected is to control the free running frequency of the LC VCO.

10. An apparatus comprising
    an inductive capacitive voltage controlled oscillator (LC VCO) to generate an output clock; and
    a voltage to current converter to receive a forwarded clock and to inject the forwarded clock to the LC VCO, wherein the output clock is a deskewed version of the forwarded clock, wherein the LC VCO is to generate the output clock having same frequency as the forwarded clock, wherein a phase difference between the output clock and the forwarded clock is based at least on some subset of free running frequency of the LC VCO and injection strength of the forwarded clock, and wherein the voltage to current converter is to program a selectable voltage to current ratio to generate the injection strength of the forwarded clock.

11. The apparatus of claim 1, wherein the LC VCO is to block jitter outside of locking range of the LC VCO.

12. The apparatus of claim 1, wherein the LC VCO is to not amplify jitter on the forwarded clock.

13. The apparatus of claim 1, wherein the LC VCO is to substantially inhibit jitter due to supply noise.

14. A receiver comprising
an injection locked inductive capacitive voltage controlled oscillator (LC VCO) to deskew a forwarded clock, wherein the injection locked LC VCO includes
  an LC VCO to generate the deskewed clock; and
  a programmable voltage to current converter to receive the forwarded clock and to inject the forwarded clock to the LC VCO, wherein injection strength of the forwarded clock is based on voltage to current ratio selected for the programmable voltage to current converter;
an amplifier to receive data; and
a latch to clock in the data based on the deskewed clock.

15. The receiver of claim 14, wherein the LC VCO is to deskew phase differences by adjusting the free running frequency thereof.

16. The receiver of claim 14, wherein the voltage to current converter is to control injection strength of the forwarded clock, and wherein relationship between deskew and free running frequency of the LC VCO is based on the injection strength of the forwarded clock.

17. The receiver of claim 14, wherein the injection locked LC VCO can absorb latch capacitive loading into an LC tank.

18. The receiver of claim 14, in combination with an energy cell to power the receiver.

* * * * *